(12) United States Patent
Nishimura

(10) Patent No.: US 8,728,830 B2
(45) Date of Patent: May 20, 2014

(54) MANUFACTURING METHOD OF MAGNETO-RESISTIVE ELEMENT

(75) Inventor: Kazumasa Nishimura, Tama (JP)

(73) Assignee: Canon Anelva Corporation, Kawasaki-Shi (JP)

( * ) Notice: Subject to any disclaimer, the term of this patent is extended or adjusted under 35 U.S.C. 154(b) by 0 days.

(21) Appl. No.: 13/494,797

(22) Filed: Jun. 12, 2012

(65) Prior Publication Data

US 2012/0288963 A1    Nov. 15, 2012

Related U.S. Application Data

(63) Continuation of application No. PCT/JP2010/073773, filed on Dec. 28, 2010.

(30) Foreign Application Priority Data

Dec. 28, 2009    (JP) .................................. 2009-298254

(51) Int. Cl.
    *H01L 21/00*    (2006.01)
(52) U.S. Cl.
    USPC ............................................................ 438/3
(58) Field of Classification Search
    None
    See application file for complete search history.

(56) References Cited

U.S. PATENT DOCUMENTS

| 7,479,394 | B2 |   | 1/2009 | Horng et al. |
| 7,567,956 | B2 | * | 7/2009 | Yu et al. ................................ 1/1 |
| 7,576,956 | B2 | * | 8/2009 | Huai ........................... 360/324.2 |
| 7,663,845 | B2 |   | 2/2010 | Hirata et al. |
| 7,934,309 | B2 | * | 5/2011 | Kawamori et al. ........ 29/603.13 |
| 2003/0016475 | A1 | * | 1/2003 | Hoshiya et al. ............ 360/324.1 |
| 2004/0101978 | A1 |   | 5/2004 | Linn et al. |
| 2007/0264423 | A1 |   | 11/2007 | Miura et al. |
| 2008/0124454 | A1 |   | 5/2008 | Djayaprawira et al. |
| 2008/0253039 | A1 | * | 10/2008 | Nagamine et al. ......... 360/324.2 |
| 2009/0004884 | A1 | * | 1/2009 | Nagamine et al. ............ 438/771 |

(Continued)

FOREIGN PATENT DOCUMENTS

| JP | 2007142424 A | 6/2007 |
| JP | 2007-173843 A | 7/2007 |

(Continued)

OTHER PUBLICATIONS

International Preliminary Report on Patentability in PCT/JP2010/073773, issued Aug. 23, 2012 (6 pages).

(Continued)

*Primary Examiner* — Charles Garber
*Assistant Examiner* — Andre' C Stevenson
(74) *Attorney, Agent, or Firm* — Fitzpatrick, Cella, Harper & Scinto

(57) ABSTRACT

The present invention provides a manufacturing method of a magneto-resistive element capable of obtaining a higher MR ratio, in a method of forming a metal oxide layer (e.g., MgO layer) by oxidation treatment of a metal layer (e.g., Mg layer). An embodiment of the present invention includes the steps of; providing a substrate having a first ferromagnetic layer; fabricating a tunnel barrier layer on the first ferromagnetic layer; and forming a second ferromagnetic layer on the tunnel barrier layer. The step of fabricating the tunnel barrier layer includes; the steps of; depositing a first metal layer on the first ferromagnetic layer; oxidizing the first metal layer; depositing a second metal layer on the oxidized first metal layer; and performing heating treatment on the oxidized first metal layer and the second metal layer at a temperature at which the second metal layer boils.

9 Claims, 5 Drawing Sheets

(56) References Cited

U.S. PATENT DOCUMENTS

| | | |
|---|---|---|
| 2009/0122450 A1 | 5/2009 | Wang et al. |
| 2009/0321246 A1 | 12/2009 | Tsunekawa et al. |
| 2010/0320076 A1 | 12/2010 | Zhao et al. |
| 2011/0094875 A1 | 4/2011 | Djayaprawira et al. |

FOREIGN PATENT DOCUMENTS

| | | |
|---|---|---|
| JP | 2007-242786 A | 9/2007 |
| JP | 2007-305768 A | 11/2007 |
| JP | 2009-117846 A | 5/2009 |
| JP | 2009-194398 A | 8/2009 |
| TW | 200614556 A | 5/2006 |

OTHER PUBLICATIONS

Butler et al., Spin-dependent tunneling conductance of Fe|MgO|Fe sandwiches. Physical Review B, 63, 054416 (2001) (13 pp.).

Isogami et al., In situ heat treatment of ultrathin MgO layer for giant magnetoresistance ratio with low resistance area product in CoFeB/MgO/CoFeB magnetic tunnel junctions. Applied Physics Letters, 93, 192109 (2008) (5 pp.).

International Search Report and Written Opinion, with English translation of International Search Report (8 pp.).

Office Action in Taiwanese Application No. 099146324, issued Jul. 16, 2013, with English translation (9 pages).

Office Action in Japanese Application No. 2011-547730, issued Dec. 17, 2013, with English translation (5 pages).

* cited by examiner

US 8,728,830 B2

MANUFACTURING METHOD OF MAGNETO-RESISTIVE ELEMENT

CROSS-REFERENCES TO RELATED APPLICATIONS

This application is a continuation application of International Application No. PCT/JP2010/073773, filed Dec. 28, 2010, which claims the benefit of Japanese Patent Application No. 2009-298254, filed Dec. 28, 2009. The contents of the aforementioned applications are incorporated herein by reference in their entireties.

TECHNICAL FIELD

The present invention relates to a manufacturing method of a magneto-resistive element exhibiting a high MR ratio.

BACKGROUND ART

A tunneling magneto-resistive (TMR) element has a structure in which a tunnel barrier layer is sandwiched between two ferromagnetic layers. When an external magnetic field is applied and the relative magnetization angle between the two ferromagnetic layers is changed, the tunneling conduction probability of an electron through the tunnel barrier layer is changed and the resistance of the TMR element is changed. Such a TMR element is applied to a read-out sensor part of a magnetic head used for a hard disk and a device such as a nonvolatile memory MRAM utilizing magnetism.

An oxide of aluminum (Al), titanium (Ti), magnesium (Mg), or the like is used as a material for the tunnel barrier layer of the TMR element. Particularly a magnesium oxide (MgO) tunnel barrier layer can have a larger magneto-resistance change rate (MR ratio) (refer to non-patent document 1).

Manufacturing methods of the MgO tunnel barrier layer include a method of forming the MgO layer directly by radio-frequency (RF) sputtering of an MgO target and a method of depositing an Mg layer and thereafter forming the MgO layer by oxidation treatment.

For a TMR element using the method of forming the MgO tunnel barrier layer directly by the RF sputtering of the MgO target, a method is disclosed (refer to non-patent document 2), which performs substrate heating after the formation of the MgO tunnel barrier layer, as a technique to improve the MR ratio particularly for a low RA (element resistance×element area).

Further, for a TMR element using the method of depositing the Mg layer and forming the MgO layer by the oxidation treatment, a method is disclosed (refer to patent document 1), which after depositing a first Mg layer, forms an MgO layer on the surface of the Mg layer by natural oxidation, and then deposits a second Mg layer, thereby forming a tunnel barrier layer including the first Mg layer/MgO layer/second Mg layer.

As another method, there is disclosed a method which after depositing a first Mg layer, performs oxidation treatment under a high pressure, thereafter deposits a second Mg layer and performs oxidation treatment under a low pressure (refer to patent document 2).

Moreover, it is disclosed to form a stacked body of a first MgO layer and a second MgO layer as the tunnel barrier layer (refer to patent document 3). In the method disclosed in patent document 3, first, a first Mg layer is formed and a first MgO layer is formed by oxidation of the first Mg layer. Then, the first MgO layer is caused to have a crystalline orientation by annealing of the first MgO layer in a magnetic field. Successively, a second Mg layer is formed on the first MgO layer and the second Mg layer is oxidized to form a second MgO layer, and thus a tunnel barrier layer is formed as the stacked body of the first MgO layer and the second MgO layer.

PRIOR ART DOCUMENT

Patent Document

Patent document 1: Japanese Patent Application Laid-Open Publication No. 2007-142424
Patent document 2: Japanese Patent Application Laid-Open Publication No. 2007-305768
Patent document 3: Japanese Patent Application Laid-Open Publication No. 2007-173843

Non-Patent Document

Non-patent document 1: Butler et al., Physical Review B, 63, 054416 (2001)
Non-patent document 2: Appl. Phys. Lett., 93-192109

SUMMARY OF INVENTION

While generally a higher MR ratio can be obtained by the formation method of performing the RF sputtering of the MgO target, there is a problem that a lot of particles are generated in this method. When the particles fall on a region corresponding to an MR element on a wafer, there arises a problem that electrical characteristics of the TMR element are deteriorated.

Meanwhile, in the method of forming the Mg layer and thereafter forming the MgO layer by the oxidation treatment, while particles are scarcely generated and this method is suitable for volume production compared to the method of performing RF sputtering of the MgO target, there is a problem that the MR ratio is small. The MR ratios obtained by the methods disclosed by the above patent documents are 34% in patent document 1 and approximately 60% in patent document 3.

Accordingly, the present invention aims at providing a manufacturing method of a magneto-resistive effect element capable of obtaining a higher MR ratio in a method of forming a metal oxide layer (e.g., MgO layer) by performing oxidation treatment on a metal layer (e.g., Mg layer).

For achieving such an object, a first aspect of the present invention is a manufacturing method of a magneto-resistive element, including a step of providing a substrate on which a first ferromagnetic layer is formed, a step of fabricating a tunnel barrier layer on the first ferromagnetic layer, and a step of forming a second ferromagnetic layer on the tunnel barrier layer, and the step of fabricating the tunnel barrier layer includes a step of depositing a first metal layer on the first ferromagnetic layer, a step of oxidizing the first metal layer, a step of depositing a second metal layer on the oxidized first metal layer, and a step of performing heating treatment on the oxidized first metal layer and the second metal layer.

A second aspect of the present invention is a manufacturing method of a magneto-resistive element, including a step of providing a substrate on which a first ferromagnetic layer is formed, a step of fabricating a tunnel barrier layer on the first ferromagnetic layer, and a step of forming a second ferromagnetic layer on the tunnel barrier layer, and the step of fabricating the tunnel barrier layer includes a step of depositing a first metal layer on the first ferromagnetic layer, a step of oxidizing the first metal layer, a step of depositing a second metal layer on the oxidized first metal layer, and a step of performing heating treatment on the oxidized first metal layer and the second metal layer at a temperature at which the second metal layer boils.

According to the present invention, it is possible to provide a magneto-resistive element having a small number of particles and a high MR ratio.

DESCRIPTION OF EMBODIMENTS

First Embodiment

Figure 1:
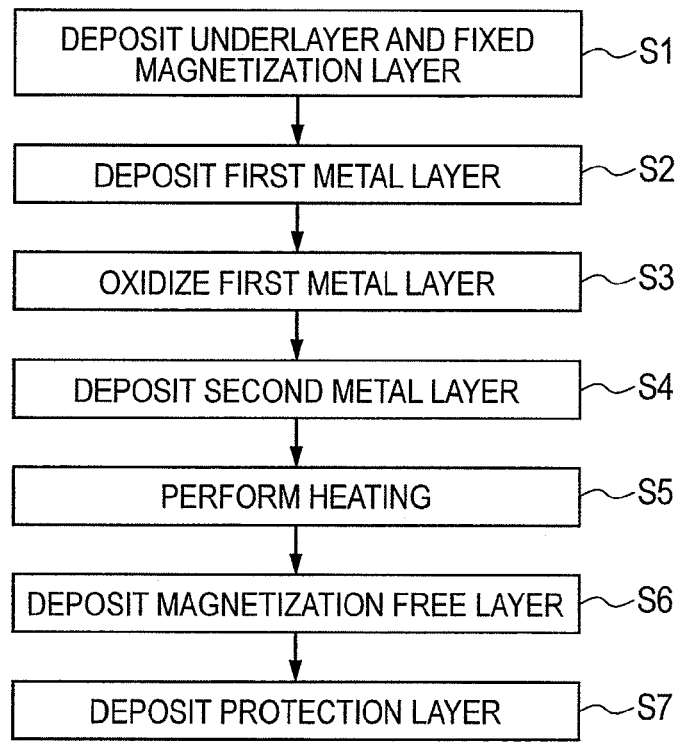
FIG. 1 is a flowchart explaining TMR element manufacturing steps according to an embodiment of the present invention.
Figure 2:
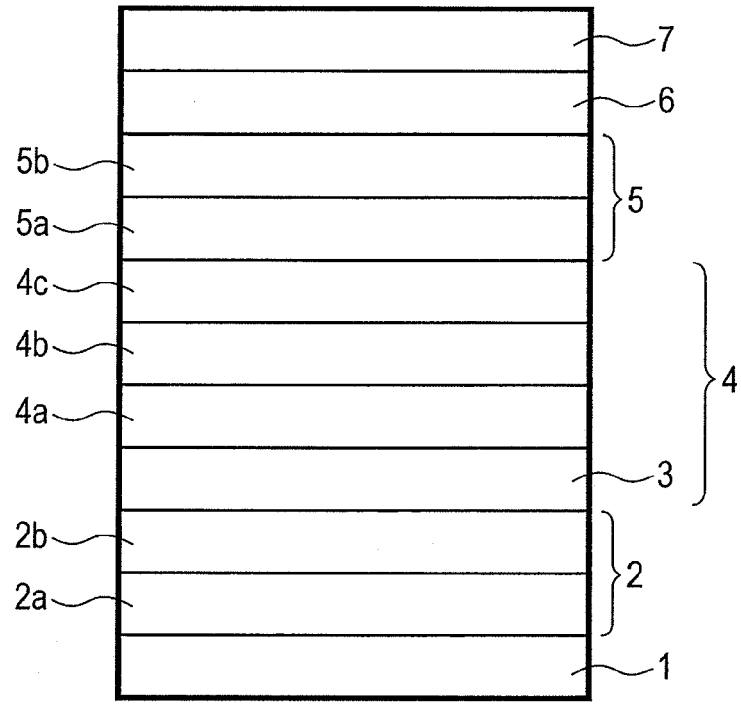
FIG. 2 is a cross-sectional view schematically showing a configuration of a TMR element manufactured by the method of FIG. 1.

FIG. 1 is a flowchart explaining manufacturing steps of a TMR element according to the present embodiment. Further, FIG. 2 is a cross-sectional view schematically showing a configuration of the TMR element according to the present embodiment.

First, as shown in FIG. 1, an underlayer having a first underlayer 2a and a second underlayer 2b and a fixed magnetization layer 4 are deposited on a processing substrate 1 in step S1. For example, the underlayer configured with tantalum (Ta), hafnium (Hf), niobium (Nb), zirconium (Zr), titanium (Ti), molybdenum (Mo), tungsten (W), or the like, for example, is deposited having a thickness of approximately 0.5 to 5 nm on the processing substrate 1 as the first underlayer 2a of the multi-layered film. The second underlayer 2b containing at least one of elements such as nickel (Ni), iron (Fe), chromium (Cr), and ruthenium (Ru), for example, is deposited thereon in approximately 0.5 to 5 nm. An anti-ferromagnetic layer 3 configured with IrMn, PtMn, FeMn, NiMn, RuRhMn, CrPtMn, or the like, for example, is deposited thereon in approximately 3 to 15 nm.

Note that, while, in the present embodiment, the stacked body of the first underlayer 2a and the second underlayer 2b are used as the underlayer 2, the underlayer 2 is not limited to this case and the underlayer 2 may be a single layer.

A ferromagnetic layer 4a which has a thickness of approximately 1 to 5 nm and is configured with CoFe or the like, for example, a nonmagnetic intermediate layer 4b which has a thickness of approximately 0.8 nm and is configured with an alloy including at least one of or two or more of Ru, Cr, rhodium (Rh), iridium (Ir), and rhenium (Re), and a ferromagnetic layer 4c which has a thickness of approximately 1 to 5 nm and is configured with CoFe, CoFeB, or the like, for example, are deposited thereon. The anti-ferromagnetic layer 3, the ferromagnetic layer 4a, the nonmagnetic intermediate layer 4b, and the ferromagnetic layer 4c form a synthetic-type fixed magnetization layer 4. The ferromagnetic layers 4a and 4c and the nonmagnetic intermediate layer 4b may be replaced by a single layer of a ferromagnetic layer. In this case, the fixed magnetization layer 4 has a two-layer structure of the anti-ferromagnetic layer 3 and the ferromagnetic layer.

While, in the present embodiment, the fixed magnetization layer 4 is formed over the substrate 1 in step S1, it is optional to use a substrate 1 over which the fixed magnetization layer 4 is preliminarily deposited. That is, in the present embodiment, any method may be used if a substrate can be provided having a ferromagnetic layer on which a tunnel barrier layer is to be formed.

In step S2, a first metal layer 5a is deposited in approximately 0.5 to 2.0 nm on the fixed magnetization layer 4. As the first metal layer 5a, Mg is preferable from the viewpoint of obtaining a high MR ratio, and Zn or an alloy of Mg and Zn is also preferable. Alternatively, the first metal layer 5a may be an alloy containing Mg.

Otherwise, the first metal layer 5a may be a metal such as Al, Ti, Zn, Hf and Ga. Moreover, oxygen may be added to the above metal illustrated as the first metal layer 5a (refer to a second embodiment), or at least one of non-metal such as boron (B), and carbon (C) may be added.

After that, in step S3, the substrate 1 over which the first metal layer 5a is formed is transferred to an oxidation chamber and the first metal layer 5a is oxidized. The oxidation treatment is performed by oxygen gas or oxygen gas and inert gas, for example, at least one of helium (He), neon (Ne), argon (Ar), krypton (Kr), and xenon (Xe). The oxidation may be performed by a method of confined oxidation which performs in the confined chamber, flow oxidation during exhaustion, radical oxidation utilizing active oxygen, plasma oxidation, or the like.

After that, in step S4, the substrate 1 over which the first metal layer 5a is oxidized is transferred to a film deposition chamber and a second metal layer 5b is deposited on the above oxidized first metal layer 5a. This layer has a function to prevent or reduce the oxidation of the magnetization free layer, which is caused by the movement of oxygen remaining on the surface of the oxidized first metal layer 5a to the magnetization free layer to be formed successively. Mg is preferable as the second metal layer 5b from the viewpoint of obtaining a high MR ratio. Otherwise, a metal of Ti, Zn, Hf, or the like may be used.

After that, in step S5, the substrate 1 over which the oxidized first metal layer 5a and the second metal layer 5b are formed is transferred to a heating chamber and heating treatment is applied thereto. That is, in the present embodiment, the heating treatment is performed after the deposition of the second metal layer 5b and also before the magnetization free layer 6 to be described below is deposited. The heating treatment promotes binding between the metal and oxygen and has an effect of enabling the barrier layer to have a more uniform and higher grade film quality. Moreover, in the present embodiment, the second metal layer 5b is evaporated by the heating treatment. In the present embodiment, as described above, the heating treatment causes oxygen and the like which remain in the oxidation of the first metal layer 5a and exist between the first metal layer 5a and the second metal layer 5b, to react with the second metal layer 5b and oxidizes the second metal layer 5b. At this time, the present embodiment removes the metal component which is not oxidized in the oxidation of the second metal layer 5b by evaporating the non-oxidized second metal layer 5b (metal component of the second metal layer 5b which has not been bound to oxygen in the heating treatment of the present step). Accordingly, the heating treatment in the present step has the function of oxidizing the second metal layer 5b and evaporating the metal component which remains without being involved in the oxidation, in addition to the function of crystallizing the metal oxide. Accordingly, the heating temperature is a temperature at which the second metal layer 5b is vaporized (temperature at which vaporization occurs), that is, a temperature at which evaporation of the second metal layer 5b occurs.

For example, when Mg is used as the first and second metal layers 5a and 5b and pressure within the heating chamber is $1\times10^{-9}$ to $1\times10^{-9}$ Torr during the heating treatment, the heating temperature is preferably 150 to 400 degrees as a substrate temperature. At a temperature of 150 degrees or lower, the binding between Mg as metal and oxygen is not promoted sufficiently and also the evaporation of Mg is not perfect. As apparent from FIG. 8, for the case of Mg, the boiling of Mg starts at approximately 423K (approximately 150° C.) in an atmosphere of $1\times10^{-9}$ to $1\times10^{-8}$ Torr. Accordingly, in the second metal layer 5b, Mg which is not bound to oxygen boils at a temperature equal to or higher than approximately 150° C. in an atmosphere of $1\times10^{-9}$ to $1\times10^{-8}$ Torr, and this Mg is vaporized, and thereby Mg which is not bound to oxygen is removed from the oxide of the second metal layer 5b. In this manner, the temperature equal to or higher than 150° C. is preferable for the evaporation of Mg. Further, at a temperature equal to or higher than 400 degrees, the synthetic antiferro coupling of the fixed magnetization layer 4 is deteriorated.

In this manner, by employing a temperature at which Mg boils as a heating temperature in the heating treatment of the second metal layer 5b, it is possible to more efficiently vaporize Mg which is not bound to oxygen. That is, it is possible to remove Mg efficiently. Further, by the efficient removal of Mg, it is possible to reduce heating treatment time of the above second metal layer 5b.

Figure 8:
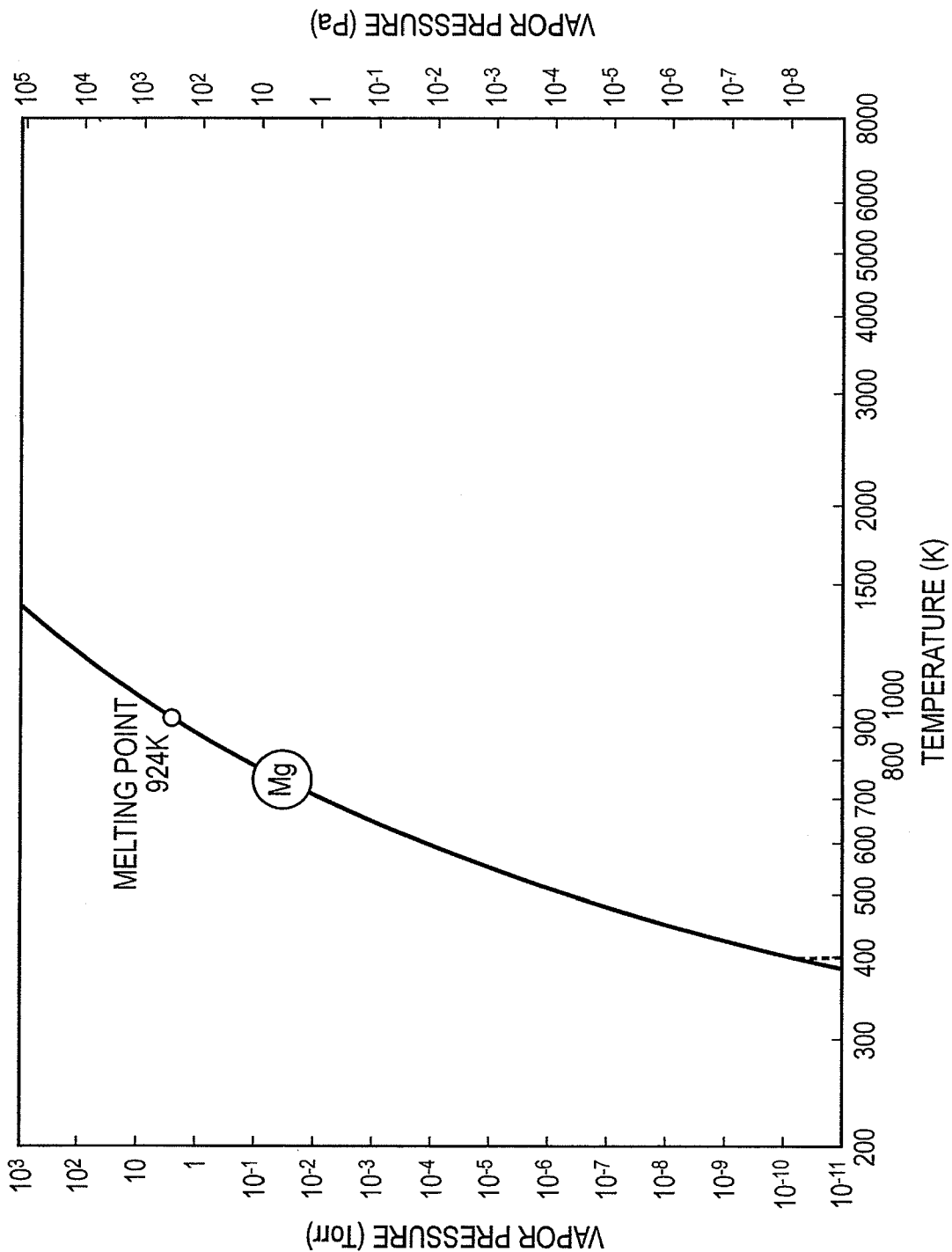
FIG. 8 is a diagram showing an Mg temperature dependence on vapor pressure according to an embodiment of the present invention.

Note that, when the pressure within the heating chamber is set to a pressure other than $1\times10^{-9}$ to $1\times10^{-8}$ Torr, obviously a temperature at which Mg evaporates may be extracted from FIG. 8 for a setting pressure. Further, also when a metal other than Mg is used as the first and second metal layers 5a and 5b, the heating treatment may be performed so as to cause the first and second metal layers 5a and 5b to be heated at a temperature at which the metal to be used evaporates according to the setting pressure utilizing a temperature dependence on vapor pressure as shown in FIG. 8.

Note that, in the present embodiment, it is important to remove Mg which is not bound to oxygen by vaporization as described above. Accordingly, even when a temperature at which Mg boils is not reached, vaporization (evaporation) of Mg occurs and it is possible to remove Mg by vaporization (evaporation) if the heating chamber is being exhausted.

Further, a preferable heating method is a method of utilizing radiation such as a heat generation resistor or a lamp heater, or a method of disposing a wafer directly on a heated stage and utilizing heat conduction. Moreover, also other heating methods may be used.

In this manner, the present step forms the tunnel barrier layer 5 having the oxidized first metal layer 5a and the oxidized second metal layer 5b.

In step S6, the substrate 1 heat-treated in step S5 is transferred to a film deposition chamber and a magnetization free layer 6 configured with at least one layer or two or more layers of CoFe, CoFeB, NiFe and the like is deposited in approximately 1 to 10 nm. Meanwhile, a cooling step may be performed before the deposition of the magnetization free layer 6 for the purpose of preventing diffusion between the tunnel barrier layer 5 and the magnetization free layer 6. The substrate may be cooled down to a temperature equal to or lower than 150 degrees.

In step S7, a protection layer 7 configured with at least one layer or two or more layers of Ta, Ru, Ti, Pt, and the like is deposited on the magnetization free layer 6 in approximately 1 to 30 nm.

Figure 3:
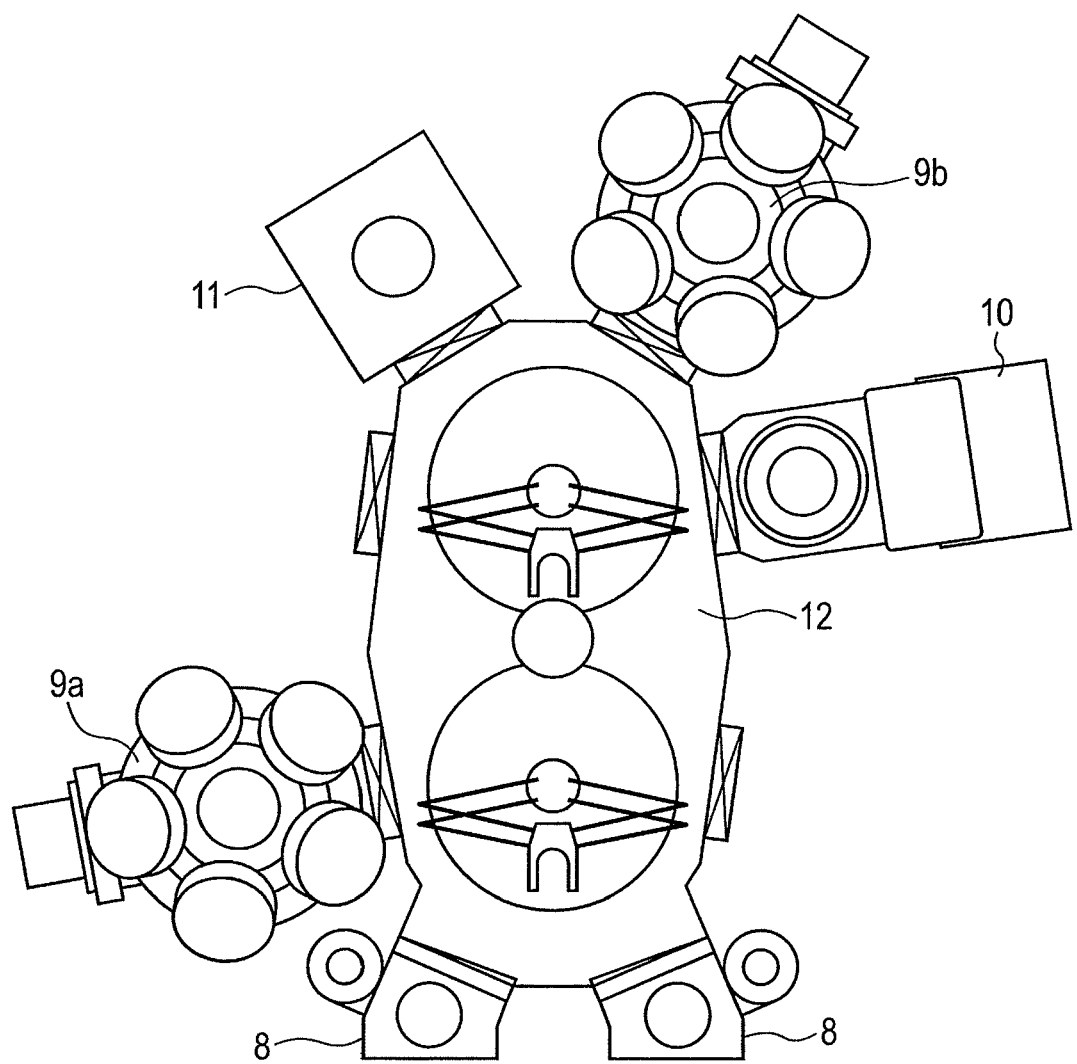
FIG. 3 is a diagram showing a configuration of a manufacturing apparatus for fabricating a TMR element according to an embodiment of the present invention.

Such a TMR element is fabricated consistently in vacuum with the use of a cluster-type substrate treatment apparatus as shown in FIG. 3.

Next, a cluster-type manufacturing apparatus of the present embodiment will be explained.

At least one or more film deposition chambers, one oxidation chamber, and one substrate heating chamber are necessary for fabricating the TMR element of the present embodiment.

For example, the substrate 1 transferred from a load-lock chamber 8 is transferred to a film deposition chamber 9a, and the underlayer 2 to the ferromagnetic layer 4c shown in FIG. 2 are deposited on the substrate 1. After that, the substrate 1 is transferred to a film deposition chamber 9b and the first metal layer 5a (e.g., first Mg layer) is deposited. After that, the substrate 1 over which the first metal layer 5a is formed is transferred to an oxidation chamber 10 and the first metal layer 5a is oxidized. After that, the substrate 1 over which the first metal layer 5a is oxidized is returned to the film deposition chamber 9b and the second metal layer 5b (e.g., second Mg layer) is deposited on the oxidized first metal layer 5a. After that, the substrate 1 over which the second metal layer 5b is formed is transferred to a heating chamber 11 and substrate heating treatment is performed. After that, the heat-treated substrate 1 is returned to the film deposition chamber 9b and the magnetization free layer 6 and the protection layer are deposited. Here, all of the load-lock chamber 8, the film deposition chambers 9a and 9b, the oxidation chamber 10, and the heating chamber are connected to one another via a transfer chamber 12. Each of the chambers is provided with an individual exhausting device and can be exhausted independently, and thereby the substrate treatment can be performed consistently in vacuum.

Here, a cooling chamber may be provided for cooling after the substrate heating treatment and the substrate may be cooled before the deposition of the magnetization free layer 6. Alternatively, the substrate may be cooled within the film deposition chamber before the deposition of the magnetization free layer 6.

The above described TMR element can be used for a read-out sensor of a hard disk magnetic head, a storage cell of an MRAM, and other magnetic sensors.

The above described embodiment shows the present invention as an illustration and does not show the present invention limitedly.

Example 1

A manufacturing method of a TMR element capable of obtaining a high MR ratio will be explained for the TMR element using the method of depositing the metal layer and thereafter forming the oxidation layer by oxidation treatment in the above described present embodiment.

Figure 4:
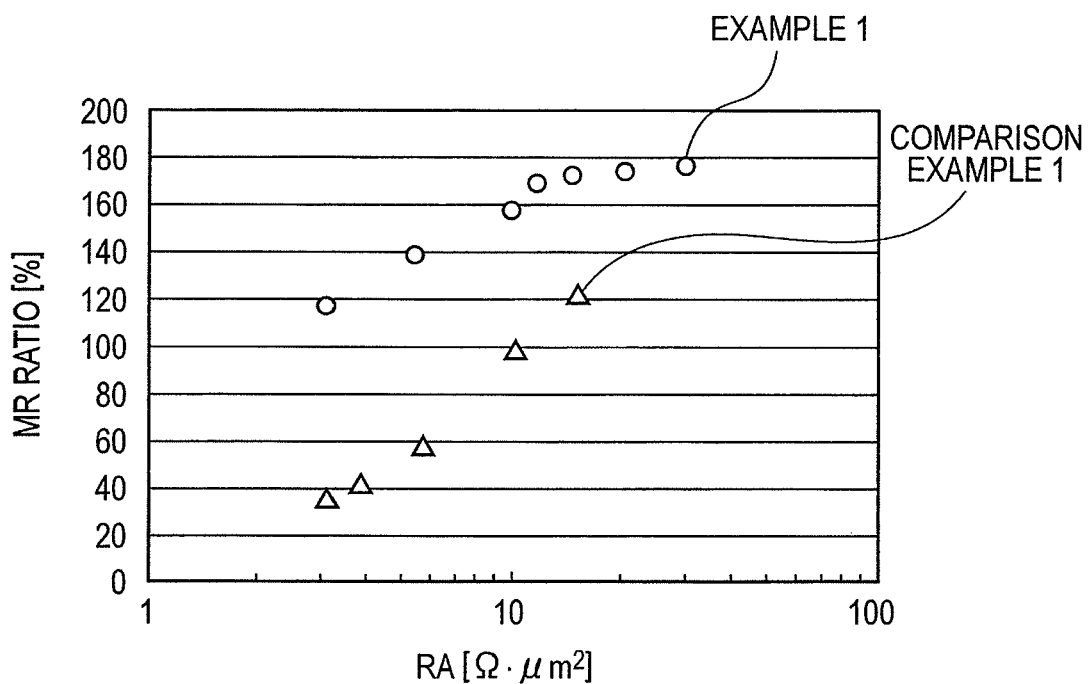
FIG. 4 is a characteristic chart showing relationships between RA and a MR ratio for a case of performing substrate heating treatment after the deposition of a second Mg layer and a case of not performing the substrate heating treatment, according to an embodiment of the present invention.
Figure 5:
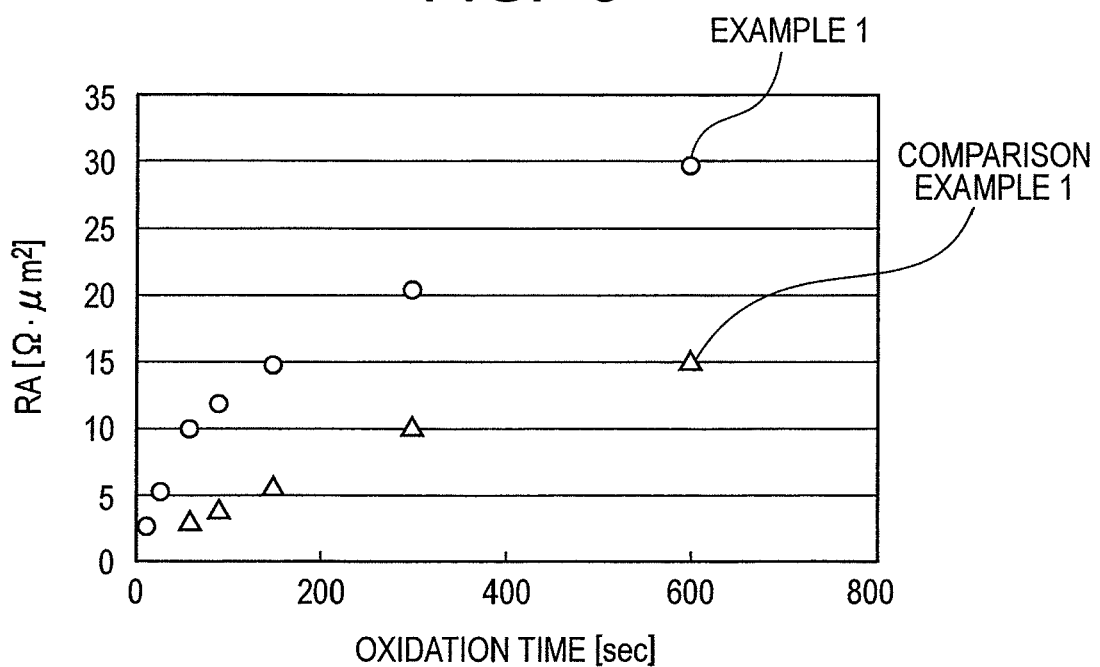
FIG. 5 is a characteristic chart showing relationships between oxidation time and RA for a case of performing substrate heating treatment after the deposition of a second Mg layer and a case of not performing the substrate heating treatment, according to an embodiment of the present invention.

In the present example, Mg was used for the first metal layer 5a and a first Mg layer was deposited in 1.2 nm as the first metal layer 5a. After that, the first Mg layer was oxidized and Mg (second Mg layer) was deposited in 0.4 nm as the second metal layer 5b. After that, TMR elements were fabricated and RA and MR ratios were measured for the case in which the substrate heating treatment (step S5 of FIG. 1) was performed at a temperature at which the second Mg layer evaporates (example 1) and the case of not performing the substrate heating treatment (comparison example 1). In the substrate heating treatment, a resistor was caused to generate heat and the substrate was heated by radiation. The substrate temperature was approximately 300 degrees. The result is shown in FIG. 4. Further, RA was changed by the change of oxidation time and a result of a relationship between the oxidation time and RA is shown in FIG. 5.

Figure 6:
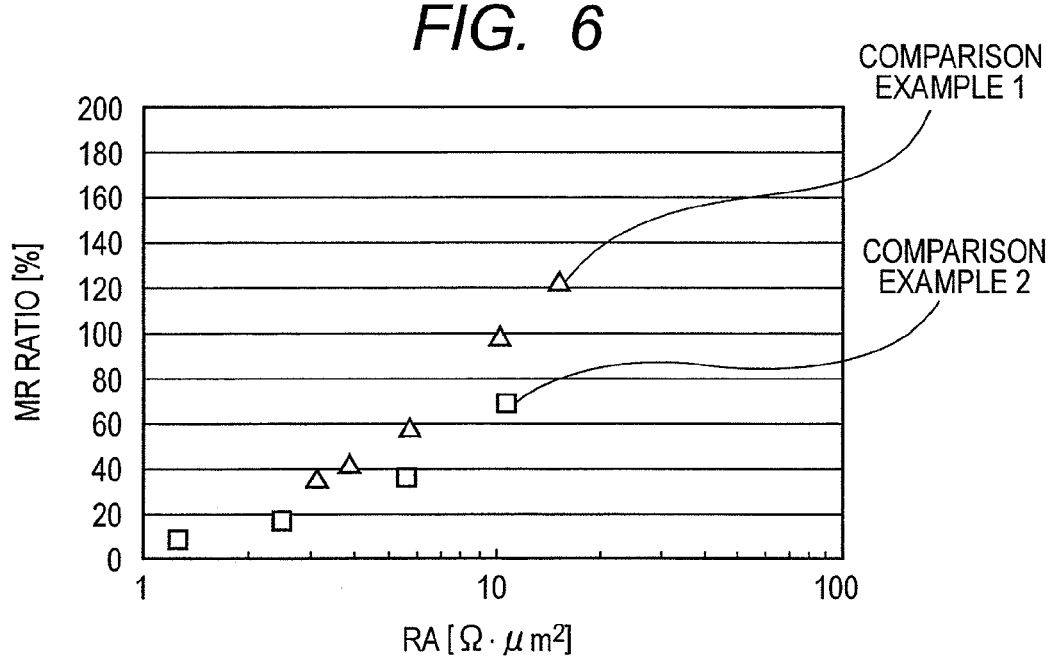
FIG. 6 is a characteristic chart showing relationships between RA and a MR ratio for a case of performing substrate heating treatment after oxidation treatment and a case of not performing the substrate heating treatment, according to an embodiment of the present invention.
Figure 7:
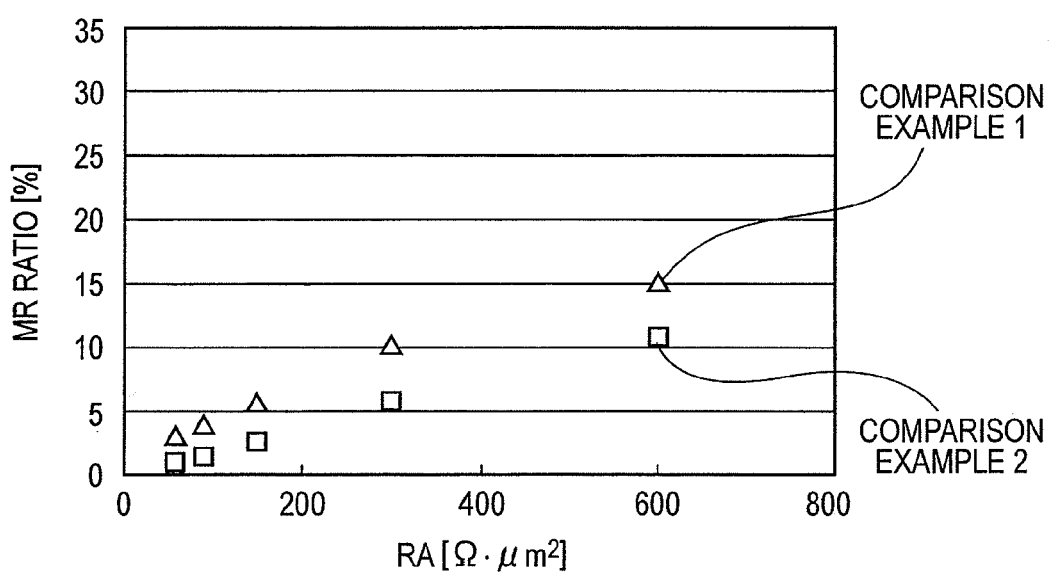
FIG. 7 is a characteristic chart showing relationships between oxidation time and RA for a case of performing substrate heating treatment after oxidation treatment and a case of not performing the substrate heating treatment, according to an embodiment of the present invention.

FIG. 6 shows relationships between RA and the MR ratio for an element obtained when the timing of the substrate heating treatment was changed (comparison example 2) and for the element obtained in the above comparison example 1. In the comparison example 2, the first Mg layer is deposited, the first Mg layer is oxidized after that, the substrate heating treatment is performed, and then the second Mg layer is deposited. Further, FIG. 7 shows a relationship between the oxidation time and RA for the TMR element fabricated in this condition.

It is found from FIG. 4 that the MR ratio is improved at an equivalent RA by the substrate heating treatment. Further, it is found from FIG. 5 that RA is increased in the case of heating treatment even at the same oxidation time. From these results, it is concluded that supposedly Mg and oxygen are not bound sufficiently in the oxidation treatment, and the binding between Mg and oxygen is promoted and defects such as pinholes can be reduced by the substrate heating treatment.

Further, from FIG. 6, when the first Mg layer is subjected to the oxidation treatment, the substrate heating treatment is performed, and the second Mg layer is deposited after the heating treatment as in the comparison example 2, for the timing of the substrate heating treatment, it is found that the element characteristic is deteriorated compared to the comparison example 1. This would be caused by that surplus oxygen atoms exist after the oxidation treatment in the vicinity of the surface of the MgO layer formed from the first Mg layer (first metal layer 5a) and the MgO is excessively oxidized or the ferromagnetic layer thereunder is oxidized by the heating treatment applied thereto, resulting in the characteristic deterioration. The result of the comparison example 1 would be similarly caused by that surplus oxygen atoms exist after the oxidation treatment on the surface of the MgO layer formed from the first Mg layer and thereby an MgO layer having a good crystalline quality is not obtained and the characteristic is deteriorated.

In the present example, the second Mg layer is deposited after the oxidation treatment of the first Mg layer and then the heating treatment is performed. Therefore, the surplus oxygen atoms existing in the vicinity of the MgO layer surface (i.e., boundary surface between the oxidized first metal layer 5a and the second metal layer 5b formed on the first metal layer 5a) and the second Mg layer (second metal layer 5b) react with each other to form a MgO layer. That is, by the substrate heating treatment (step S5) of the present example, oxygen existing at the above boundary surface is bound to Mg of the second Mg layer to convert the second Mg layer into MgO. The formation of the MgO layer and the crystallization of MgO are promoted by performing the substrate heating treatment and a MgO layer having a good crystalline quality in which a stoichiometric proportion of Mg:O is close to 1:1 is obtained, and thereby the good result was presumably obtained compared to the comparison examples.

In this manner, in the present embodiment, by forming the first metal layer 5a, oxidizing the first metal layer 5a, then forming the second metal layer 5b on the oxidized first metal layer 5a, and thereafter performing the substrate heating treatment, it is possible to reduce the influence of oxygen inevitably remaining in the vicinity of the metal layer surface on the MR ratio when oxidizing the metal layer which is the original material of the tunnel barrier layer. That is, in the present embodiment, the second metal layer 5b is formed after the oxidation of the first metal layer 5a and the heating treatment is performed in the state in which oxygen exists at the boundary surface between the first metal layer 5a and the second metal layer 5b, and thereby it is possible to use the oxygen remaining in the vicinity of the metal layer surface, which caused the deterioration of the MR ratio conventionally, for the oxidation of the second metal layer 5b and resultantly it is possible to obtain an effect equivalent to the effect of removing the oxygen existing at the above boundary surface. This oxidation is caused by the oxygen existing at the above boundary surface and therefore it is possible to eliminate or reduce the oxygen remaining on the surface of the oxidized first metal layer 5a. Further, the heating temperature causing the above oxidation is set to a temperature at which the evaporation of the second metal layer 5b occurs, and thereby non-oxidized components are vaporized and removed in the second metal layer 5b and it is possible to form a metal oxide in which oxygen remaining on the surface is reduced.

As described hereinabove, in the method to obtain a metal oxide layer such as the MgO layer by oxidation treatment of a metal layer such as Mg layer, it is important to deposit a metal layer (e.g., Mg layer) after the formation of the metal oxide layer (e.g., MgO layer) and to perform heating treatment after the metal layer has been deposited. Then, by this method, it is possible to provide a magneto-resistive element in which the MR ratio is improved compared to the conventional one.

Note that, while the positions of the magnetization free layer 6 and the fixed magnetization layer 4 are described limitedly in the above described embodiment and examples, the positions of the magnetization free layer 6 and the fixed magnetization layer 4 are not particularly specified in the present invention. That is, the magnetization free layer 6 may be formed on the lower side of the tunnel barrier layer 5 and the fixed magnetization layer 4 may be formed on the upper side of the tunnel barrier layer 5.

Second Embodiment

In the present embodiment, the first metal layer 5a intentionally contains oxygen elements in the formation of the first metal layer 5a (the first metal layer 5a is doped with oxygen). That is, in the present embodiment, in the formation of the first metal layer 5a, oxygen gas is also introduced into the film deposition chamber and the first metal layer 5a is formed while oxygen is contained therein.

For example, when the first metal layer 5a is deposited by plasma sputtering, it is possible to cause the first metal layer 5a to contain oxygen atoms therein by adding oxygen to plasma formation gas in step S2 of FIG. 1. That is, a target of metal (e.g., Mg) which becomes the material of the first metal layer 5a is provided in the film deposition chamber, inert gas is introduced into the film deposition chamber and plasma is generated, and the first metal layer 5a is formed over the substrate 1 by plasma sputtering of the above target. In the above example, oxygen gas is introduced into the film deposition chamber in addition to the inert gas. At this time, the supplied oxygen gas may be or may not be excited into plasma. Accordingly, when sputter particles (e.g., Mg particles) sputtered from the target and the oxygen (oxygen ion or oxygen radical when excited into plasma) are supplied to the substrate and the first metal layer is deposited over the substrate so as to take in the supplied oxygen. That is, the first metal layer doped with oxygen is formed.

The timing to introduce the oxygen gas for the above oxygen doping may be the same as or may be different from the timing to introduce the inert gas of the sputtering gas. Further, the timing to terminate the oxygen gas supply may be the same as or may be different from the timing to terminate the inert gas supply.

When Mg is used as the first metal layer 5a and Ar gas is used as the inert gas, for example, Mg may be deposited as the first metal layer 5a in an atmosphere in which Ar gas and oxygen gas are introduced independently from each other in 15 sccm and 5 sccm, respectively (mixed oxygen concentration is 25%), for example.

In the present embodiment, the first metal layer 5a contains oxygen, and thereby it is possible to perform the oxidation of the first metal layer 5a preferably also in the vicinity of the boundary surface between the first metal layer 5a and the ferromagnetic layer 4c which is the lower layer of the first metal layer 5a.

Usually, when the second layer is oxidized in a stacked body in which a second layer is formed on a first layer, control of the oxidation needs to be performed strictly for oxidizing the second layer in the vicinity of the boundary surface with the first layer. If the oxidation is excessively strong, the first layer is also oxidized, and, if the oxidation is excessively weak, a non-oxidized part remains in the second layer.

Meanwhile, in the present embodiment, because the first metal layer 5a is deposited at the same time oxygen is introduced as described above, the oxygen distributes in the thickness direction of the first metal layer 5a formed on the ferromagnetic layer 4c and oxygen exists also in the vicinity of the boundary surface with the ferromagnetic layer 4c within the first metal layer 5a. Accordingly, in the oxidation treatment of step S3, oxygen preliminarily contained in the first metal layer 5a contributes to the oxidation of the first metal layer 5a, and therefore the oxidation is performed preferably also in the vicinity of the boundary surface of the first metal layer 5a by the oxygen contained in the first metal layer 5a. Therefore, a good quality metal oxide (e.g., MgO) caused by the first metal layer 5a can be formed also at the boundary surface between the first metal layer 5a and the ferromagnetic layer 4c.

The invention claimed is:

1. A manufacturing method of a magneto-resistive element, comprising:
    a step of fabricating a tunnel barrier layer on a first ferromagnetic layer formed on a substrate; and
    a step of forming a second ferromagnetic layer on the tunnel barrier layer,
    wherein the step of fabricating the tunnel barrier layer includes:
        a step of depositing a first metal layer on the first ferromagnetic layer;
        a step of oxidizing the first metal layer;
        a step of depositing a second metal layer on the oxidized first metal layer; and
        a step of performing heating treatment on the oxidized first metal layer and the second metal layer prior to the step of forming a second ferromagnetic layer, and
    wherein the first metal layer and the second metal layer comprise magnesium.

2. The manufacturing method of a magneto-resistive element according to claim 1, wherein the step of depositing the first metal layer forms the first metal layer so as to cause the first metal layer to contain oxygen therein.

3. The manufacturing method of a magneto-resistive element according to claim 1, wherein the step of performing heating treatment binds oxygen remaining on a surface of the first metal layer oxidized in the step of oxidation to the second metal layer by the heating treatment.

4. The manufacturing method of a magneto-resistive element according to claim 1, wherein the substrate which has been subjected to the heating treatment is cooled after the step of performing heating treatment.

5. A manufacturing method of a magneto-resistive element, comprising:
    a step of fabricating a tunnel barrier layer on a first ferromagnetic layer formed on a substrate; and
    a step of forming a second ferromagnetic layer on the tunnel barrier layer,
    wherein the step of fabricating the tunnel barrier layer includes:
        a step of depositing a first metal layer on the first ferromagnetic layer;
        a step of oxidizing the first metal layer;
        a step of depositing a second metal layer on the oxidized first metal layer; and
        a step of performing heating treatment on the oxidized first metal layer and the second metal layer at a temperature at which the second metal layer boils prior to the step of forming a second ferromagnetic layer, and
    wherein the first metal layer and the second metal layer comprise magnesium.

6. The manufacturing method of a magneto-resistive element according to claim 1, wherein the heating treatment is performed at a temperature at which the second metal layer boils.

7. The manufacturing method of a magneto-resistive element according to claim 1, wherein each of the steps is performed consistently in a vacuum.

8. The manufacturing method of a magneto-resistive element according to claim 1, wherein the manufacturing method of the magneto-resistive element is performed by a treatment apparatus comprising a load-lock chamber and a deposition chamber.

9. The manufacturing method of a magneto-resistive element according to claim 8, wherein the treatment apparatus is a cluster-type treatment apparatus comprising a transfer chamber.

* * * * *